United States Patent [19]

Hine et al.

[11] Patent Number: 5,771,052
[45] Date of Patent: Jun. 23, 1998

[54] SINGLE PASS INK JET PRINTER WITH OFFSET INK JET MODULES

[75] Inventors: Nathan P. Hine, South Strafford, Vt.;
Edward R. Moynihan, Plainfield, N.H.

[73] Assignee: Spectra, Inc., Hanover, N.H.

[21] Appl. No.: 743,544

[22] Filed: Nov. 4, 1996

Related U.S. Application Data

[60] Continuation-in-part of Ser. No. 458,738, Jun. 2, 1995, Pat. No. 5,640,184, which is a division of Ser. No. 406,297, Mar. 17, 1995, which is a continuation-in-part of Ser. No. 215, 301, Mar. 21, 1994, Pat. No. 5,659,346.

[51] Int. Cl.⁶ .............................. B41J 2/155; B41J 2/14; B41J 2/045
[52] U.S. Cl. .............................. 347/42; 347/47; 347/49; 347/71; 347/72
[58] Field of Search .................................. 347/42, 70, 71, 347/72, 89, 93, 85, 40; 342/42, 47, 70, 48, 49, 71, 72

[56] References Cited

U.S. PATENT DOCUMENTS

| 4,318,114 | 3/1982 | Huliba | 347/89 |
| 5,296,875 | 3/1994 | Suda | 347/93 |
| 5,489,925 | 2/1996 | Brooks et al. | 347/6 |
| 5,640,184 | 6/1997 | Moynihan | 347/47 |

FOREIGN PATENT DOCUMENTS 423-820  4/1991  European Pat. Off. ........... B41J 2/17

*Primary Examiner*—Benjamin R. Fuller
*Assistant Examiner*—Thien Tran
*Attorney, Agent, or Firm*—Baker & Botts, L.L.P.

[57] ABSTRACT

A single pass ink jet printer includes a plurality of ink jet modules arranged in adjacent rows extending across the width of the surface of an object which is moved with respect to the printer. The modules are mounted on and joined to a manifold which is mounted in a support frame. Ink is supplied to the manifold through an opening in the frame and the manifold distributes the ink to corresponding openings in the ink jet modules where it is directed to arrays of ink pressure chambers and to an outlet which communicates with a corresponding return passage in the manifold leading back to the ink supply. As a result, ink is circulated continuously through all of the ink jet modules, thereby maintaining pigment in suspension in a pigmented ink. An ink supply is removably connected to the printhead through quick-disconnect couplings and, to prevent contamination of the ink in the printhead, filters are provided in the ink supply and at the inlet to the printhead. An additional filter, designed to trap only those particles which would block the orifices in the orifice plate, is positioned between the ink jet modules and the orifice plate.

14 Claims, 7 Drawing Sheets

5,771,052

SINGLE PASS INK JET PRINTER WITH OFFSET INK JET MODULES

REFERENCE TO RELATED APPLICATIONS

This application is a continuation-in-part of the Moynihan at al. application Ser. No. 08/458,738, filed Jun. 2, 1995, now U.S. Pat. No. 5,640,184, which is a division of the Moynihan et al. application Ser. No. 08/406,297 filed Mar. 17, 1005, which is a continuation-in-part of the Moynihan et al. application Ser. No. 08/215,301 filed Mar. 21, 1994, now U.S. Pat. No. 5,659,346.

BACKGROUND OF THE INVENTION

This invention relates to ink jet printers and, more particularly, to ink jet printers arranged to print images in a single pass of an object moving adjacent to the printer.

In many instances, it is desirable to print images on a continuously moving object such as a package carried on a conveyor, or on a web or a sheet of substrate in a single pass, i.e., without requiring any repeated or return motion of the ink jet head with respect to the object. The spacing of ink jet orifices in an ink jet printer in a row extending across the width of the substrate, however, normally does not provide high enough resolution to produce an acceptable image. Moreover, in many cases it is desirable to be able to change the color of the ink used in printing without replacing the printhead but conventional printers are not usually capable of permitting printing of different colored inks from the same printhead.

SUMMARY OF THE INVENTION

Accordingly, it is an object of the present invention to provide a single pass ink jet printer which overcomes the disadvantages of the prior art.

Another object of the invention is to provide a single pass ink jet printer capable of printing with inks of different colors using the same printhead.

A further object of the invention is to provide a single pass ink jet printer capable of providing a high resolution image.

These and other objects of the invention are attained by providing an ink jet printer having a printhead with one or more arrays of orifices extending across the full width of a printed image to be produced on an object in which the printhead has a plurality of ink jet modules extending transversely to the direction of motion of the web with respect to the ink jet head and in which the modules communicate with orifices in an orifice plate which are arranged in offset relation with respect to each other in the direction of web motion. Preferably, in order to print relatively wide images of acceptable resolution, such as ten inches (25.4 cm.) or more, several sets of ink jet modules are provided and the ends of adjacent modules in the direction across the width of the web are overlapped so as to supply ink to orifices corresponding to adjacent image regions in the images produced on the web. Ink is supplied to each of the modules through passages in a manifold plate which is interposed between the modules and the orifice plate and is supported by a support frame. Preferably each of the modules also has an outlet passage and the manifold also has return passages, thereby permitting ink to circulate continuously through all of the modules even when they are not used in printing so as to maintain suspension of pigment in a pigmented ink.

In order to assure a uniform ink drop size at all ambient temperatures, heaters may be provided in the support frame to maintain the ink at a predetermined temperature regardless of ambient temperature variations. If hot melt ink is used, the heaters may be controlled to maintain the ink at a temperature above its melting point.

To permit replacement or interchange of ink supplies, the printhead also includes quick-disconnect couplings and to avoid contamination of the ink within the head a separate filter is provided between the quick-disconnect coupling and the printhead at the intake side. In a particular embodiment providing a resolution of approximately 275 dots/inch (108 dots/cm.) and a print width of about 5.6 inches (14.2 cm.), twelve ink jet modules each supplying 128 orifices are provided in two adjacent rows extending perpendicular to the direction of web motion with the ends of the modules in one row extending between the ends of the modules in the other row so that the adjacent ink jet modules communicate with orifices corresponding to adjacent image regions in the orifice plate.

In another embodiment providing approximately 600 dot/inch (236 dot/cm.) resolution across a 10¼ inch (26.0 cm.) print width, 48 modules are aligned in four rows spaced across the width of the web, each module supplying 128 orifices.

BRIEF DESCRIPTION OF THE DRAWINGS

Further objects and advantages of the invention will be apparent from a reading of the following description in conjunction the accompanying drawings in which.

DESCRIPTION OF PREFERRED EMBODIMENTS

Figure 1:
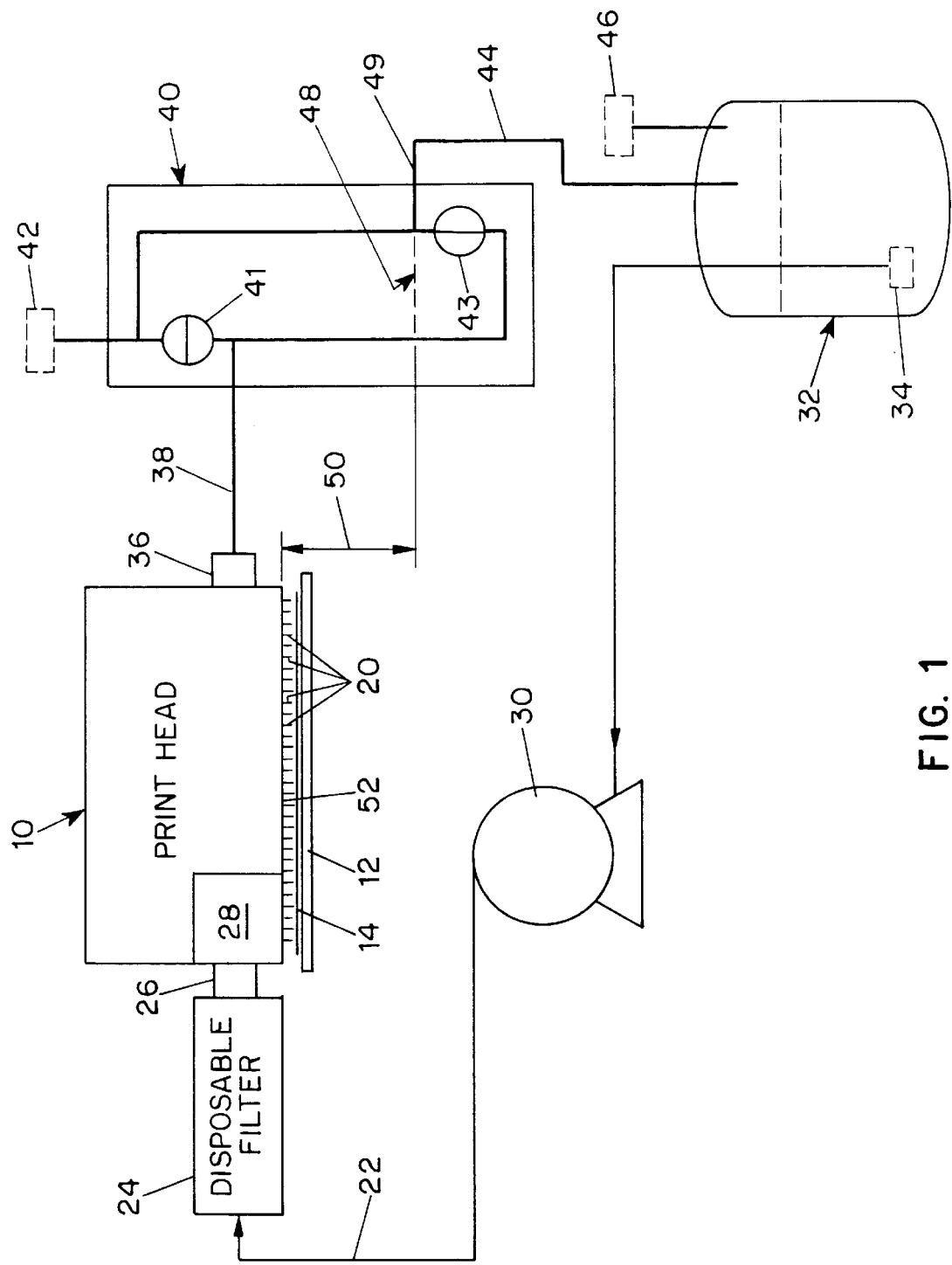
FIG. 1 is a schematic block diagram illustrating the arrangement of a representative embodiment of a single pass ink jet printer in accordance with the invention.

In the representative arrangement schematically illustrated in FIG. 1, a printhead 10 is disposed adjacent to a platen 12 on which a substrate 14, such as a web of paper, is supported. In operation, the web of paper 14 is continuously driven in a direction perpendicular to the plane of the figure and, in response to printing signals received on a line 16 from a control unit 18, the printhead 10 ejects ink drops from orifices in an orifice plate along adjacent paths 20 in a manner described hereinafter. The drops are ejected toward the web 14 in timed relation to the motion of the web to produce in a single pass an image which may extend substantially across the full width of the substrate. In this way, the necessity for scanning a printhead across the width of the substrate is eliminated and the image can be printed in a single scanning motion between the substrate and the printhead i.e., the motion of the web 14 with respect to the printhead 2.

It will be understood that, instead of being applied to a web 14 supported on a platen 12, the surface to which the ink drops are applied may be the surface of an object such as a package carried past the printhead 10 by a conveyor.

In order to supply ink of selectable color to the printhead, an ink supply line 22 is connected through a disposable filter 24 and a quick disconnect coupling 26 to a further filter 28 which is a part of the printhead 10. Ink is circulated from the supply line 22 through the printhead in the manner described hereinafter by a pump 30 which withdraws ink from a disposable ink bottle 32 through a strainer 34. At the outlet end of the printhead 10, another quick disconnect coupling 36 is connected to a return line 38 leading to a J-tube unit 40 having a vent open to the atmosphere through a filter 42.

A standpipe drain 44 leads from the J-tube unit 40 to the disposable ink bottle 32 which in turn is vented through a filter 46 to the atmosphere. To prevent weeping of ink from the orifices in the orifice plate, a slight negative pressure is maintained at the printhead orifices by positioning the J-tube unit 40 so that the level of ink 48 in the J-tube outlet 49 to the standpipe drain 44 is at a selected distance 50 below the ink jet orifices which are in an orifice plate 52 at the bottom of the printhead as viewed in FIG. 1. The J-tube unit 40 includes a valve 41 between the inlet from the return line 38 and the filter 42 which is normally closed but may be opened to purge air bubbles from the standpipe 44 and another valve 43 between the inlet 38 and the outlet 49 which is normally open but may be closed when pressure is applied to the ink in the printhead to purge the orifices in the orifice plate 52. As described hereinafter, the orifice plate 52 in the printhead 10 is preferably a single plate formed with 1536 orifices for the embodiment described hereinafter with respect to FIGS. 2–5 or 6144 orifices for an orifice plate used in an embodiment of the type shown in FIGS. 6 and 7.

Because clogging of a single orifice in the orifice plate with foreign material could cause sufficient image degradation to make the printhead unusable, and since the quick disconnect couplings for the ink supply provide an opportunity for introduction of contaminants into the system, specific filtering arrangements are provided to prevent any contamination of the ink supplied to the orifices in the printhead. For this purpose, both the disposable ink bottle 32 and the J-tube unit 40, which are vented to the atmosphere, have their vents covered with the filters 42 and 46, which preferably are one micron filters, to prevent contamination as air is drawn into those components during operation of the system. In addition, the disposable filter 24, which preferably is a five-to-ten micron cartridge-type filter, is included in the line 22 at the quick disconnect coupling 26, and the filter 28, which is preferably a ten-micron Nucleopore filter, trap any contaminants which might be introduced when the quick disconnect coupling is disconnected and reconnected.

Figure 2:
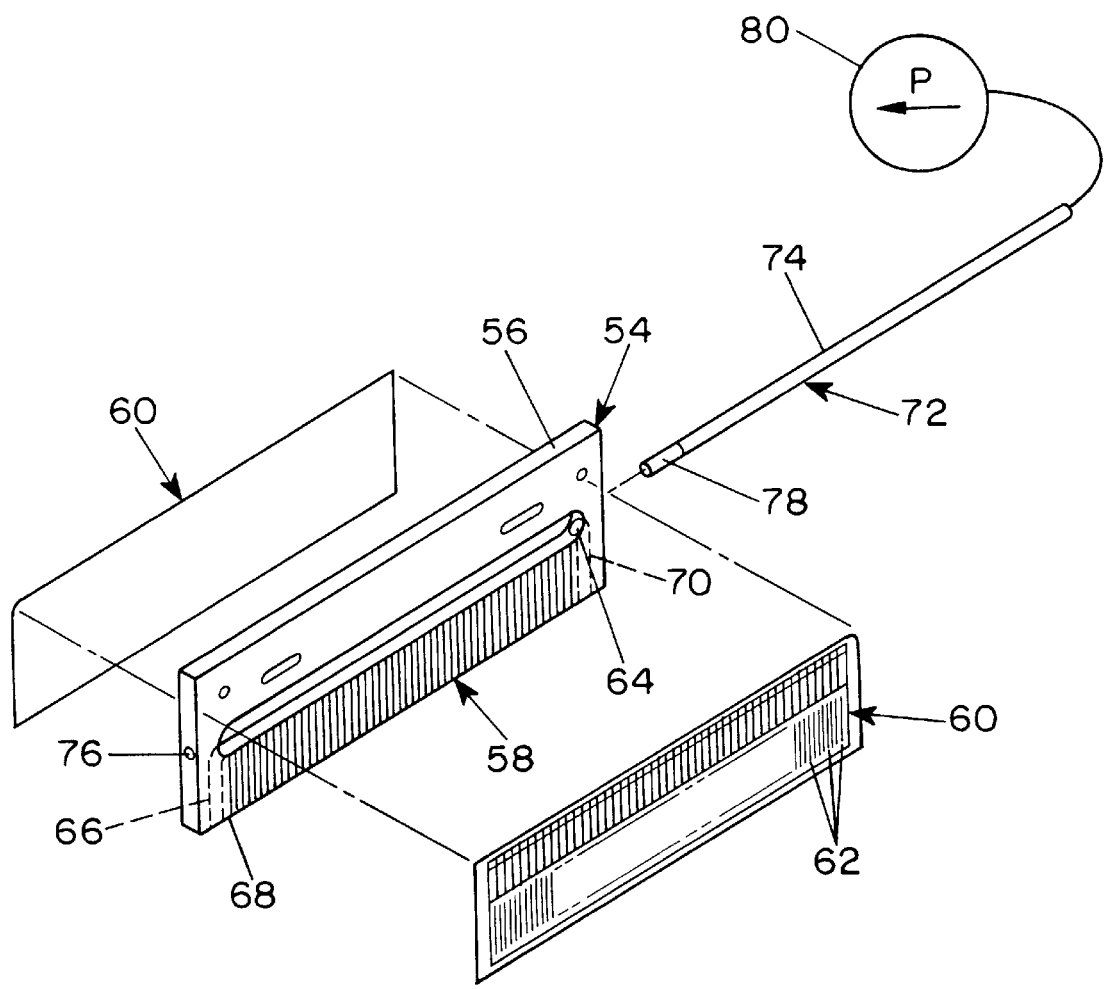
FIG. 2 is a schematic perspective exploded view showing a representative arrangement of an ink jet module for use in the printer of the invention.

In the exploded view of FIG. 2, the arrangement of a representative ink jet module 54 which is used in the printhead 10 is illustrated. The manufacture and assembly of such ink modules is described in detail in the Moynihan et al. application Ser. No. 08/406,297, the disclosure of which is incorporated by reference herein. The ink jet module 54 shown in FIG. 2 includes a carbon pressure chamber plate 56 which is formed on opposite sides with arrays 58 of closely spaced grooves forming ink pressure chambers and each of those arrays is covered by a piezoelectric transducer plate 60 having an array of electrodes 62 which are positioned with respect to the pressure chambers in the arrays 58 so as to selectively deflect a corresponding portion of the transducer plate and thereby change the volume of a corresponding pressure chamber in response to an appropriate electrical signal.

The pressure chamber plate 56 also has a longitudinally extending opening 64 which, in the illustrated embodiment, receives ink at one end from an internal passage 66 leading from the lower end surface 68 of the plate 56 and, after supplying ink to the pressure chamber, discharges ink at the opposite end through an internal passage 70 to an opening in the lower end 68 of the plate.

In order to extract dissolved air from the ink as it is passing through the longitudinally extending opening 64, a deaerator 72, consisting of a tubular member 74 made of air-permeable, ink-impermeable material such as extruded poly-tetrafluoroethylene, preferably having a 0.1 mm. thickness and a 1.5 mm. internal diameter, extends through the longitudinally extending opening 64 and through an opening 76 in the end of the pressure chamber plate 56. A plug 78 closes the projecting end of the tubular member 74 and the opposite end is connected to a vacuum source 80 supplying a sufficient negative pressure, such as 0.7 atmosphere, to reduce the dissolved air content of the ink passing through the longitudinal opening 64 to a level below the level at which air bubbles can form in the pressure chamber during operation of the ink jet system. In order to prevent the tube 72 from collapsing in response to the application of negative pressure, a porous support such as a rod of porous carbon or helical wire having a diameter substantially equal to the internal diameter of the tube is inserted into the tube.

Figure 3:
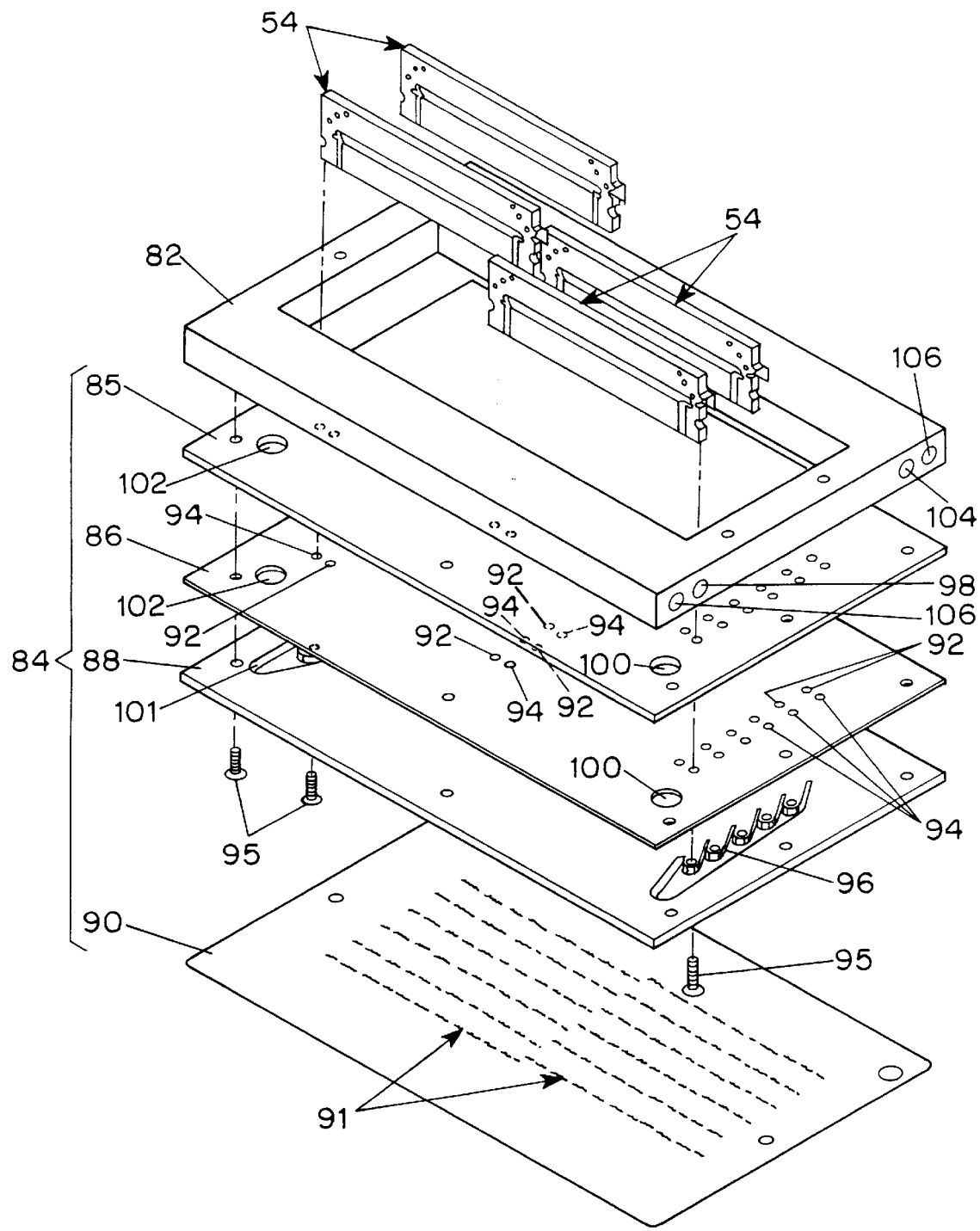
FIG. 3 is a perspective exploded view showing certain of the components of a representative embodiment of an ink jet printhead for use in the printer of the invention.
Figure 4:
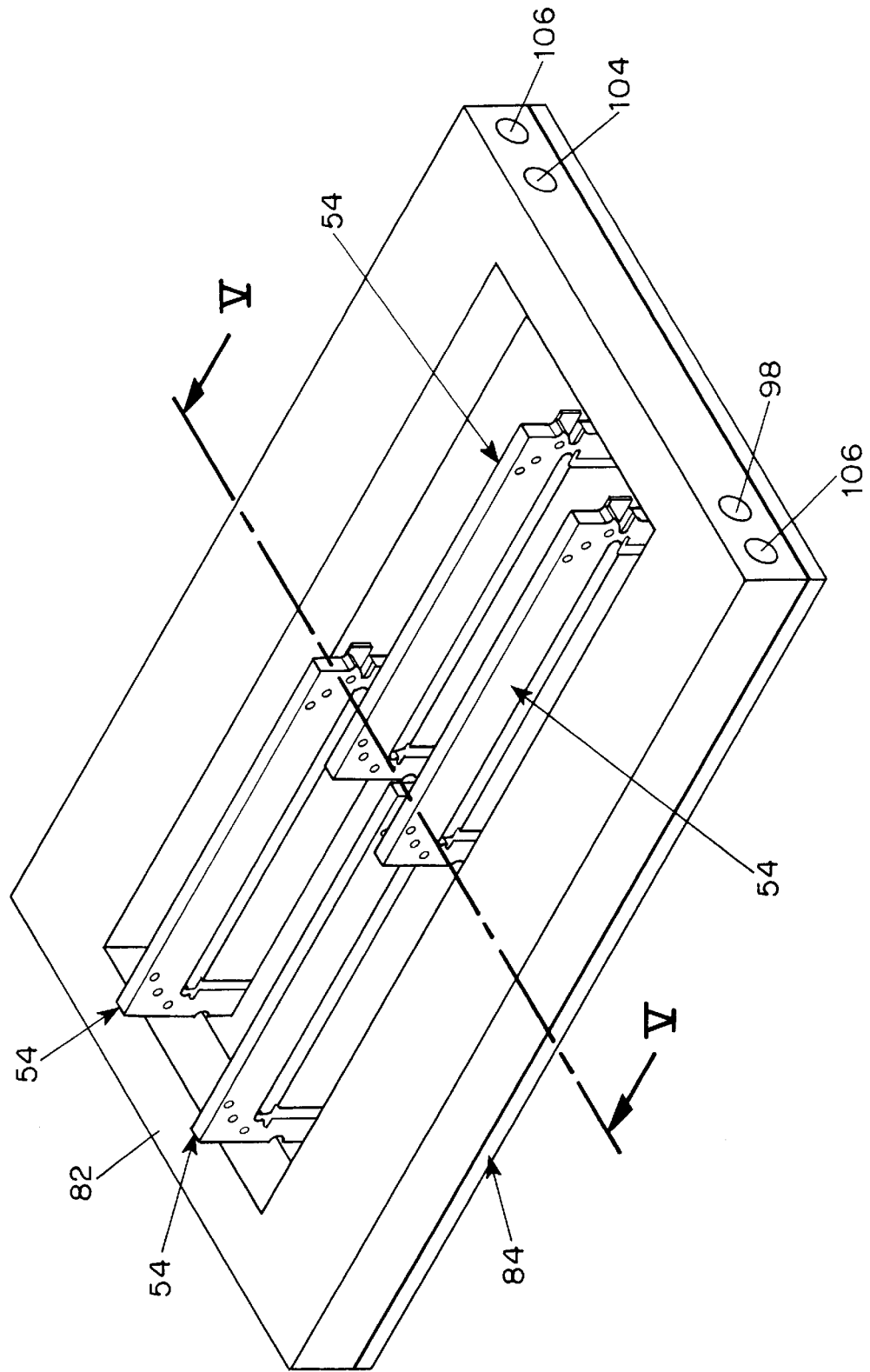
FIG. 4 is a perspective view illustrating the components of FIG. 3 in assembled relation.

To form the printhead 10 a plurality of ink jet modules 54 are mounted on a manifold sandwich 84 which is positioned in a support frame 82. The manifold sandwich 84 consists of a stiffener plate 85, a filter layer 86, a manifold plate 88 and an orifice plate 90 as shown in FIGS. 3 and 4. The orifice plate 90 has linear arrays of uniformly spaced orifices 91 arrayed in two groups with the end orifices in adjacent arrays spaced from each other in the direction of the arrays at the same spacing as the orifices in the arrays. Moreover, the orifices in the successive arrays in each group are offset by a distance equal to the orifice spacing in each array divided by the number of arrays in each group minus one. In this way the resolution in the resulting image in the direction along the length of the arrays is equal to the number of orifices per unit length in each array multiplied by the number of arrays in the group.

The filter layer 86 in the manifold assembly 84 is provided to block potentially orifice-clogging solid material from reaching the orifices 91 in the orifice plate 90 but to permit particles of solid material smaller than the size of the orifices in the plate 90 to pass through the filter layer. The filter layer may be of the type described, for example, in the co-pending Moynihan et al. application for "filter arrangement for ink jet head" Ser. No. 08/231,102 filed Apr. 22, 1994, the disclosure of which is incorporated herein by reference. For example, if the orifices 91 have a diameter of about 50 $\mu$m, the size of the openings in the filter layer 86 may be about 25 to 30 $\mu$m.

The stiffener plate 85 is provided to impart rigidity and electrical isolation to the manifold sandwich 84 and may be made, for example, of ceramic alumina material. Both the stiffener plate 85 and the filter layer 86 have a plurality of holes 92 which are aligned with the ink inlet and outlet passages 66 and 70 in each of the ink jet modules 54 and with screw holes 94 for screws 95 by which the modules are secured to the manifold plate 88 and for further screws 95 by which the manifold plate is secured to the support frame 82, the orifice plate 90 being adhesively bonded to the manifold plate 88.

The manifold plate is of the type described in the above-mentioned Moynihan et al. application Ser. No. 08/406,297 and has appropriate passages 96 by which ink received through an inlet opening 98 on the edge of the frame 82 and passing through openings 100 in the filter layer 86 and the stiffener plate is distributed to the ink inlet openings 66 in the ink jet modules 54. Ink delivered to the manifold plate from the ink outlet openings 70 in the modules is carried by corresponding return passages 101 in the manifold plate 88 and through openings 102 in the filter layer and the stiffener plate to an outlet opening 104 in the edge of the support frame 82. The support frame outlet opening 104 is in turn connected through the quick disconnect coupling 36 to the return line 38 shown in FIG. 1.

For convenience in forming the necessary passages, the manifold plate 88 is preferably made of carbon as described in the above-mentioned application Ser. No. 08/406,297 while, for purposes of imparting rigidity, the support frame 82 may be made of aluminum. The support frame 82 includes two further apertures 106 to accommodate heating elements arranged to maintain the manifold assembly 84 at a uniform and constant temperature above ambient temperature.

FIG. 4 illustrates an assembled printhead in which, for simplicity of illustration, only the four ink jet modules 54 shown in FIG. 3 have been mounted in the frame 82. The cross-sectional view of FIG. 5, however, shows all twelve ink jet modules 54 mounted in the frame 82. These are provided in two side-by-side groups with the adjacent ends of the modules being overlapped. With 128 jets in each ink jet module spaced at 0.022 inch (0.56 mm.), a resolution of about 275 dots per inch (108 dots/cm.) in the direction across the web and a maximum image width of about 5.6 (14.2 cm.) inches are provided.

Figure 5:
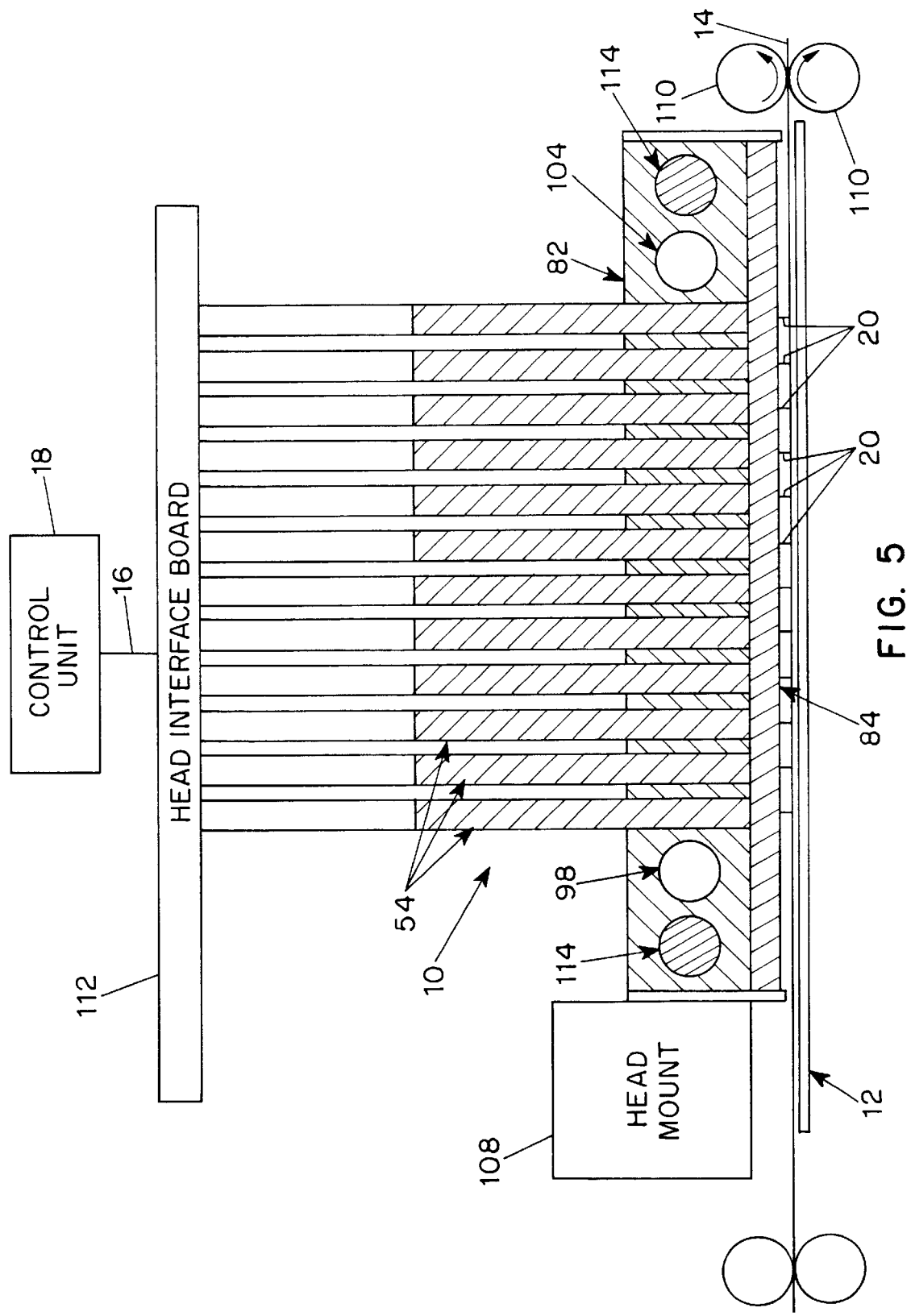
FIG. 5 is a schematic cross-sectional view illustrating the disposition of the printhead shown in FIG. 4 in the printer of the invention.

Moreover, since the printhead itself does not contain the ink reservoir, there is a minimal volume of ink within the printhead. Consequently, when the ink supply is disconnected from the printhead and another ink supply with a different kind of ink is to be used, the ink remaining in the printhead may be flushed out quickly and conveniently before the new ink supply is connected to the printhead, with the outlet line 38 being connected to a waste disposal until the new ink has passed through the printhead. As shown in FIG. 5, the printhead 10 is supported by a head mount 108 adjacent to the web 14 in closely spaced relation to the platen 12 and the web 14 is moved continuously by drive rolls 110 past the orifice plate 88 from which ink drops are deposited on the web along corresponding paths 20. The ink jet modules 54 are connected to a head interface board 112 which receives drop ejection actuation signals on the line 16 from the control unit 18 and supplies them to the modules 54 at the appropriate times to produce the image on the web 14 as it moves past the printhead.

As also shown in FIG. 5, heaters 114 are mounted in the support frame openings 106. In this embodiment, which is especially useful for inks which are liquid at room temperature, the heaters 114 are preferably controlled to maintain a constant uniform temperature in the printhead at a level which should be slightly above maximum ambient temperature so that the viscosity of the ink, and therefore the drop size, may be kept constant.

Figure 6:
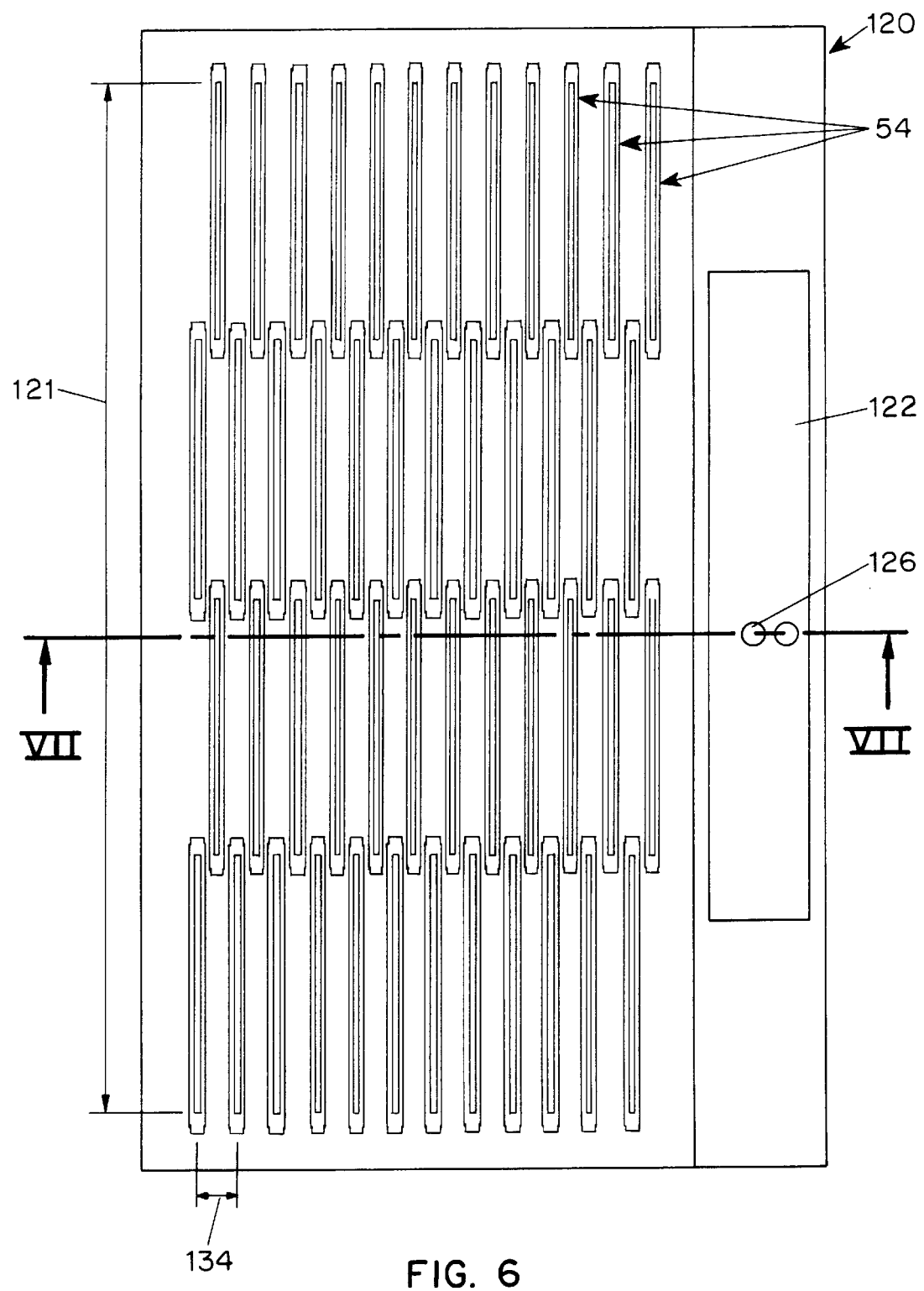
FIG. 6 is a schematic plan view illustrating a further representative embodiment of the invention.
Figure 7:
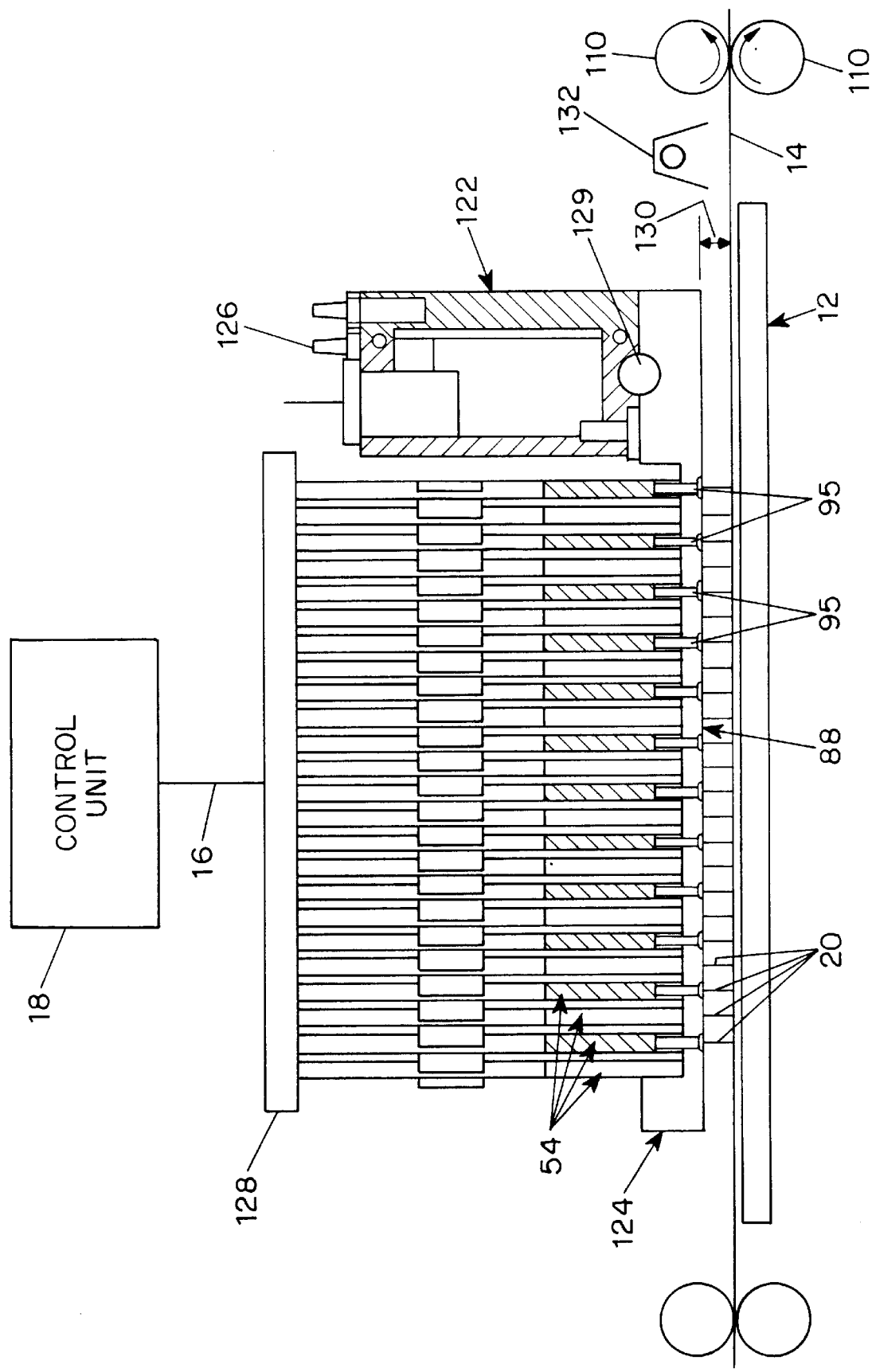
FIG. 7 is schematic cross-sectional view of the embodiment shown in FIG. 6 taken on the line VII—VII and looking at the direction of the arrows.

In the further embodiment shown in FIG. 6 and 7, a printhead 120 contains forty-eight modules 54 arranged in the manner described above with respect to the first embodiment except that the orifices in each row are spaced by about 0.020 inch (0.51 mm.) and four groups of twelve modules each are provided in side-by-side overlapped relation across the width 121 of a web, thereby producing a print image width of about 10¼ inches (26.0 cm.). In this embodiment, as shown in FIG. 7, a replaceable ink reservoir 122 is mounted in a frame 124 in which the modules 54 are mounted by affixing the reservoir to the printhead. Relative motion and vibration between the reservoir and the printhead are thus minimized, thereby avoiding pressure surges which could affect the jetting and the image quality. In this case, the reservoir 122 is sealed from the atmosphere and has a connection line 126 leading to a negative pressure source to maintain the desired negative pressure of about three to five inches (7.6 to 12.7 cm.) water gauge at the orifice plate. As in the embodiment of FIGS. 2–5, each ink jet module 54 is connected to an interface board 128 which in turn is connected through the line 16 to the control unit 18 which supplies actuating signals to the piezoelectric transducer electrodes to initiate drop ejection. For use with hot melt ink, the ink reservoir 122 as well as the frame 124 and the modules 54 are maintained at a temperature above the melting point of the ink by printhead heaters of the type described above with respect to FIG. 5 and a reservoir heater 129 shown schematically in FIG. 7.

In certain ink jet systems a liquid ink may be used which is curable by exposure to ultraviolet or other radiation. In such cases the printer may include a radiation source 132 for curing the ink applied to the web 14 as it leaves the printhead 10.

In response to the actuating signals from the control unit, ink drops are ejected along paths 20 toward a web 14 which is driven by the drive rolls 110 along a platen 12 spaced at a small distance 130 of about 0.02 to 0.03 inch (0.51 to 0.76 mm.) from the orifice plate in the manifold assembly 84. With this arrangement, a resolution of about 600 dots per inch (236 dots per cm.) can be provided across an image width of about 10¼ inches (26.0 cm.), the resolution in the direction of web motion being controlled by the web speed and the rate at which actuating signals are supplied to the ink jet modules so as to provide approximately the same image resolution in that direction. Preferably, the adjacent modules 54 in each group have a spacing 134 of about 0.32 to 0.4 inch (0.8 to 1.0 cm.) so that the overall width of the array of modules in the direction of motion of the web is about 3.5 to 4.4 inches (8.9 to 11.2 cm.).

In high resolution ink jet systems drop placement and drop volume errors cause loss of image quality. Providing heaters arranged to maintain a constant and uniform ink temperature as described above reduces drop volume errors to a tolerable level. Drop placement errors are minimized by positioning the orifices in the orifice plate with an accuracy of about 0.0001 inch (2.5 $\mu$m), by maintaining the web 14 at the minimum possible distance 130 from the orifice plate, and by maintaining the tracking of the web 14 in precise alignment with the axis of the printhead.

If desired, multi-color images can be produced by providing two or more printheads 10 in succession along the path of motion of the web 14. In this case, the corresponding image pixel orifices in the orifice plates of the printheads must be in precise alignment and precise tracking of the web 14 must be maintained during its passage adjacent to the successive printheads. It will be understood that, instead of being applied to a web 14 driven by drive rolls 110 across a platen 12, the ink drops ejected from the printhead may be applied to adjacent surfaces of objects such as packages or containers carried by a conveyor in the same direction as the web.

Although the invention has been described herein with reference to specific embodiments, many modifications and variations therein will readily occur to those skilled in the art. Accordingly, all such variations and modifications are included within the intended scope of the invention.

I claim:

1. A single pass ink jet printer comprising:
   drive means for conveying an object having an image-receiving surface in a selected direction; and
   an ink jet printhead disposed in closely spaced relation to the object to project ink drops toward the image-receiving surface thereof, the printhead comprising:
   a support frame having an opening;
   an orifice plate affixed to the support frame and having at least one row of orifices extending substantially perpendicular to the direction of motion of an image-receiving surface and in a direction across a width of the image-receiving surface;
   a manifold plate formed with a plurality of passages communicating with the orifices in the orifice plate and having additional passages for conveying ink from an ink inlet to a plurality of ink jet modules; and
   a plurality of ink jet modules supported within the opening in the support frame and having end faces communicating with passages in the manifold plate to supply ink therethrough to orifices in the orifice plate with which the passages communicate, the ink jet modules extending in the direction across the width of the image-receiving surface and having ink pressure chambers and associated transducers corresponding to the orifices in the orifice plate; and
   an ink supply reservoir for supplying ink to the printhead.

2. A single pass ink jet printer according to claim 1 including:
   a quick disconnect coupling connecting the ink supply reservoir to the printhead; and
   a filter between the quick disconnect coupling and the printhead to trap contaminants introduced during replacement of said ink supply reservoir.

3. A single pass ink jet printer according to claim 2 including:
   a return line for returning ink from the printhead to the ink supply reservoir; and
   an additional quick disconnect coupling for connecting the return line to the printhead.

4. A single pass ink jet printer according to claim 3 including:
   a disposable filter in the ink supply line connected to the quick disconnect coupling.

5. A single pass ink jet printer according to claim 1 wherein the ink supply includes:
   an ink reservoir; and
   a pump for circulating ink from the ink reservoir to the printhead.

6. A single pass ink jet printer according to claim 1 including:
   a filter layer disposed between the orifice plate and the ink jet modules and having openings large enough to block particles which are too large to pass through the orifices in the orifice plate but not large enough to block particles which are small enough to pass through orifices in the orifice plate.

7. A single pass ink jet printer according to claim 1 including:
   an elongated passage in each ink jet module providing a path through which ink flows to the ink pressure chambers therein; and
   a deaeration tube disposed in the elongated passage and made of an air-permeable, ink-impermeable material and connected to a source of subatmospheric pressure.

8. A single pass ink jet printer according to claim 1 wherein each ink jet module includes:
   an ink inlet passage;
   an ink distribution passage for receiving ink from the inlet passage and distributing ink to the ink pressure chambers in the module; and
   an ink outlet passage for receiving ink from the ink distribution passage; and
   wherein the manifold plate includes:
   an ink supply passage for supplying ink to ink inlet passages in the ink jet modules; and
   an ink return passage for receiving ink from outlet passages in the ink jet modules and communicating with the outlet line from the printhead.

9. A single pass ink jet printer according to claim 1 including twelve ink jet modules disposed in two groups of six modules each, the modules in each group having ends overlapping with ends of the modules in another group and wherein:
   each ink jet module comprises a carbon plate with an array of ink pressure chambers disposed on each side of the carbon plate and includes:
   a piezoelectric transducer mounted on each side of the carbon plate and having electrodes for actuating portions of the transducer corresponding to adjacent ink pressure chambers in the carbon plate.

10. A single pass ink jet printer according to claim 9 wherein the orifice plate includes a plurality of rows of orifices arranged in groups and the orifices in each row of orifices in the orifice plate are spaced by about 0.02 inch (0.57 mm.) and the rows in each group are offset to provide uniform spacing between image pixels produced by successive orifices in the direction of motion of the image-receiving surface thereby providing a resolution of approximately 275 dots per inch (108 dots/cm.) in the direction across the width of the image receiving surface.

11. A single pass ink jet printer according to claim 1 including forty-eight ink jet modules disposed in four groups of twelve modules each, the modules in each group having ends overlapping with ends of the modules in adjacent groups and wherein:
   each ink jet module comprises a carbon plate with an array of ink pressure chambers disposed on each side of the carbon plate and includes:
   a piezoelectric transducer mounted on each side of the carbon plate and having electrodes for actuating portions of the transducer corresponding to the adjacent ink pressure chambers in the carbon plate.

12. A single pass jet ink printer according to claim 11 wherein the orifice plate includes a plurality of rows of orifices arranged in groups and the orifices in each row are spaced by about 0.02 inch (0.57 mm.) and the rows in each group are offset to provide uniform spacing between image pixels produced by successive orifices in the direction of motion of the image-receiving surface thereby providing a resolution of approximately 600 dots per inch (236 dots/cm.) in the direction across the width of the image-receiving surface.

13. A single pass ink jet printer according to claim 1 including a heater in the printhead for maintaining ink therein at a substantially uniform constant temperature.

14. A single pass ink jet printer according to claim 1 including a radiation source for curing an ink image deposited on the image-receiving substrate after the substrate has moved past the printhead.

* * * * *